(12) United States Patent
Miyamura et al.

(10) Patent No.: US 12,245,405 B2
(45) Date of Patent: *Mar. 4, 2025

(54) FASTENING SYSTEMS FOR MANIFOLDS OF DATACENTER RACKS

(71) Applicant: NVIDIA Corporation, Santa Clara, CA (US)

(72) Inventors: Harold Miyamura, San Jose, CA (US); Jeremy Rodriguez, Santa Cruz, CA (US); Ali Heydari, Albany, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/325,915

(22) Filed: May 30, 2023

(65) Prior Publication Data

US 2023/0301034 A1 Sep. 21, 2023

Related U.S. Application Data

(63) Continuation of application No. 16/923,920, filed on Jul. 8, 2020, now Pat. No. 11,700,713.

(51) Int. Cl.
*H05K 7/20* (2006.01)
*F16M 13/02* (2006.01)
*H05K 7/14* (2006.01)

(52) U.S. Cl.
CPC ......... *H05K 7/20781* (2013.01); *F16M 13/02* (2013.01); *H05K 7/1488* (2013.01); *H05K 7/20272* (2013.01)

(58) Field of Classification Search
CPC ........... H05K 7/20272; H05K 7/20781; H05K 7/20327; H05K 7/1417
See application file for complete search history.

(56) References Cited

U.S. PATENT DOCUMENTS

| | | | |
|---|---|---|---|
| 6,754,992 B1* | 6/2004 | Byfield | ................ E04B 1/2403 52/36.5 |
| 7,639,499 B1 | 12/2009 | Campbell et al. | |
| 8,953,329 B1 | 2/2015 | Heydari | |
| 9,198,321 B1 | 11/2015 | Heydari | |
| 9,359,012 B2* | 6/2016 | Yao | ....................... F16B 37/042 |
| 10,123,449 B1 | 11/2018 | Stevens et al. | |
| 10,485,133 B1 | 11/2019 | Revol et al. | |

(Continued)

FOREIGN PATENT DOCUMENTS

| | | |
|---|---|---|
| CN | 101385408 A | 3/2009 |
| CN | 101442893 A | 5/2009 |

(Continued)

OTHER PUBLICATIONS

ASETEK: "Installation, Operation & Maintenance Guide InRackCDU (4U-V2)," Oct. 2019, pp. 1-28.

(Continued)

*Primary Examiner* — Bradley Duckworth
(74) *Attorney, Agent, or Firm* — Lowenstein Sandler LLP

(57) ABSTRACT

A system comprising an adapter plate to couple a plurality of different types of cooling manifolds to one or more racks in a datacenter is disclosed. Additionally, a system comprising an adapter plate to adaptively couple a cooling manifold to a plurality of different types of server racks is disclosed.

16 Claims, 9 Drawing Sheets

(56) References Cited

U.S. PATENT DOCUMENTS

| | | |
|---|---|---|
| 10,701,838 B1 | 6/2020 | Conroy et al. |
| 10,791,647 B1* | 9/2020 | Miyamura ............ H05K 7/1487 |
| 10,980,154 B1* | 4/2021 | Gao .................... H05K 7/20781 |
| 11,700,713 B2* | 7/2023 | Miyamura .......... H05K 7/20272 |
| | | 248/220.31 |
| 2006/0082970 A1* | 4/2006 | Walz .................. H05K 7/20645 |
| | | 361/699 |
| 2010/0127141 A1 | 5/2010 | Chan et al. |
| 2016/0128238 A1 | 5/2016 | Shedd et al. |
| 2017/0105313 A1 | 4/2017 | Shedd et al. |
| 2018/0092254 A1 | 3/2018 | Shelnutt et al. |
| 2019/0182989 A1 | 6/2019 | Chen et al. |
| 2021/0153390 A1 | 5/2021 | Tufty et al. |
| 2021/0307208 A1 | 9/2021 | Shao et al. |

FOREIGN PATENT DOCUMENTS

| | | |
|---|---|---|
| CN | 110446396 A | 11/2019 |
| CN | 110447315 A | 11/2019 |
| WO | 2016069313 A1 | 5/2016 |

OTHER PUBLICATIONS

International Search Report and Written Opinion for International Application No. PCT/US2021/039627, mailed Oct. 15, 2021, 10 Pages.

Office Action for Chinese Patent Application No. 2021800068055, mailed Jun. 1, 2024, 31 Pages.

\* cited by examiner

FASTENING SYSTEMS FOR MANIFOLDS OF DATACENTER RACKS

RELATED APPLICATIONS

The present application is a continuation of U.S. patent application Ser. No. 16/923,920, filed Jul. 8, 2020, which is incorporated by reference herein.

FIELD

At least one embodiment pertains to fastening systems for fastening a manifold to a rack in a datacenter. In at least one embodiment, a fastening system includes an adapter plate that is associated with the manifold and that has holes to receive buttons in configurable positions, which enable the buttons to mate with keyholes of a bracket of the rack in order to fasten the manifold to the bracket.

BACKGROUND

Datacenter cooling systems use fans to circulate air through server components. Certain supercomputers or other high capacity computers may use water or other cooling systems than air cooling systems to draw heat away from the server components or racks of the datacenter to an area external to the datacenter. The cooling systems may include a chiller within the datacenter area that is external to the datacenter. The chiller may be a cooling tower or other external heat exchanger that receives heated coolant from the datacenter and disperses the heat by forced air or other means to the environment (or an external cooling medium) before the cooled coolant is recirculated back into the datacenter to exchange heat with a secondary cooling loop via a coolant distribution unit (CDU). In an example, the chiller and the cooling tower together form a chilling facility with pumps responsive to temperature measured by external devices applied to the datacenter. Air cooling systems do not draw sufficient heat to support effective or efficient cooling in datacenters and liquid cooling systems are capable of significantly damaging server components or racks by electrical shorting, flooding, or other issues. The capacity of the datacenter, such as the number of power density components are limited in part due to ineffective or inefficient air cooling in datacenters. The above-referenced issues of a liquid cooling system, such as electrical conductivity, leaks and flooding, must be addressed prior to deployment of the liquid cooling system.

BRIEF DESCRIPTION OF THE DRAWINGS

Various embodiments in accordance with the present disclosure will be described with reference to the drawings, in which.

DETAILED DESCRIPTION

Figure 1:
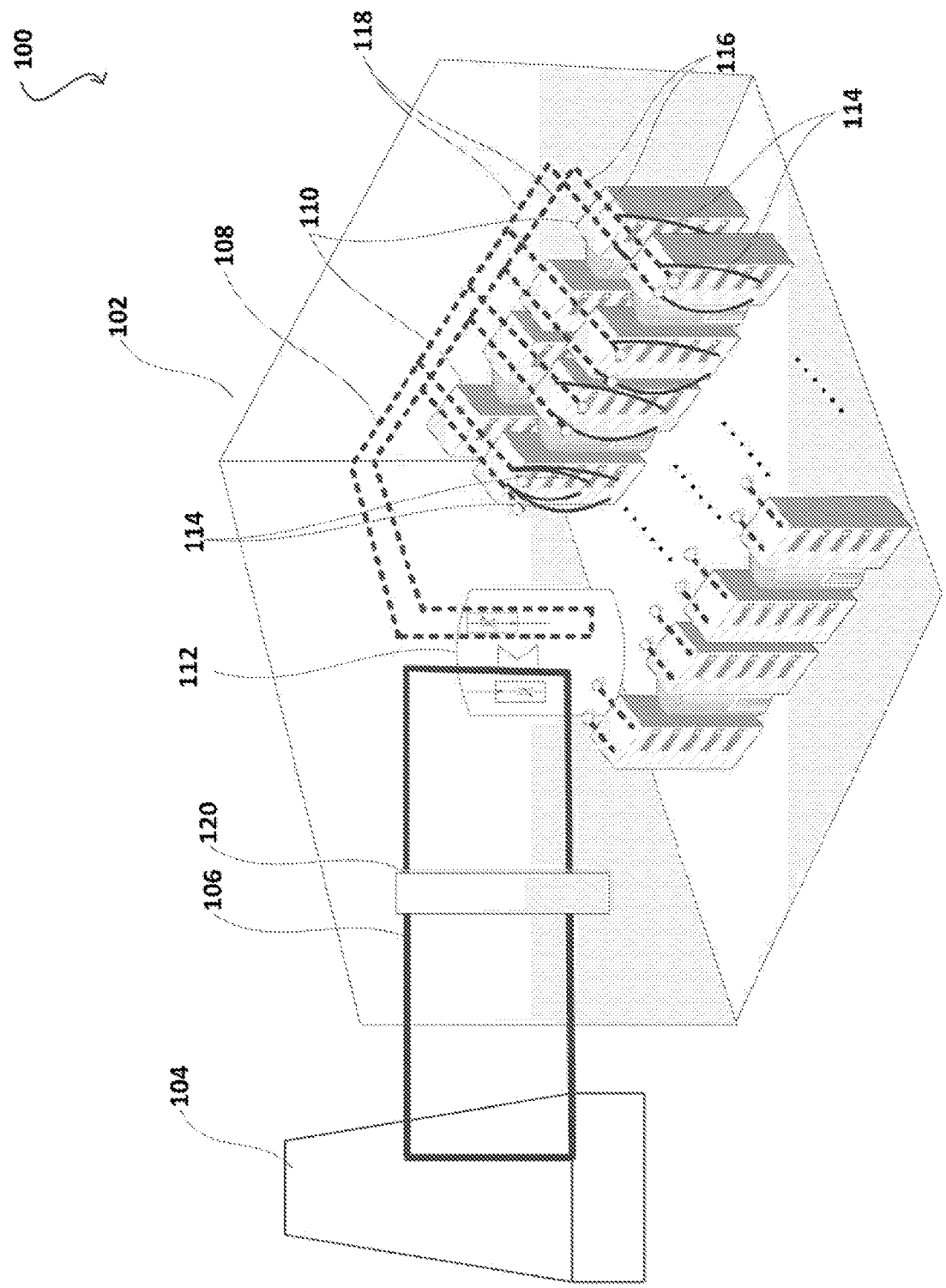
FIG. 1 is a block diagram of an example datacenter having a cooling system subject to improvements described in at least one embodiment.

Air cooling of high density servers is inefficient and ineffective in view of the high heat requirements caused by present day computing components. Further, air cooling is stressed and limited by its capacity to address emerging high density components generating high heat requirements. As such, the present disclosure seeks prospects in liquid coolants and associated systems for cooling high power computing components such as a graphics processing unit (GPU), a central processing unit (CPU), or switching components. These computing components are used in servers assembled in or associated with at least racks (such as information technology (IT) racks) in a datacenter. One issue addressed in the present disclosure is an inability to provide fast installations or fixes of any manifold issues (such as to removing affixing rack manifolds) because of the weight of the manifolds, which may be pre-loaded with liquid coolant, and because of a requirement to align and locate the manifold during installation with proprietary brackets or with legacy components of a rack.

For instance, a datacenter liquid cooling system is supported by a chiller plant or system that passes coolant through one or more cooling loops. The chiller plant or system is at least associated with a primary cooling loop (also referred to primary supply and return loop), which extracts heat from a secondary cooling loop that may be associated with one or more cooling loops within servers and/or racks. The secondary cooling loop extracts heat from components or the one or more cooling loops within the servers and/or racks, and exchanges the heat to the primary cooling loop. The liquid cooling system includes many intermediate features, such as pumps, coolant distribution units (CDUs), and heat exchangers. Manifolds receive liquid coolant and guide the liquid coolant to receiving features of the racks and/or servers.

Deployment of datacenter hardware for addressing requirements in the fields of artificial intelligence and machine learning includes installation of substantial computational capabilities having extremely dense server racks of GPU/CPU servers with very fast networking equipment. The density of the racks may leave little room for the cooling hardware or components, such as in-rack CDUs. Challenges may be presented in the form of accessibility of the cooling system to address and fix aspects, during on-time for the servers when the racks are functioning, without substantial downtime. Further, challenges may be also presented during cold-switching of component, such as cold swapping a field replaceable unit (FRU) or a CDU having pump failures. In addition, the challenges may be greatly amplified by the cooling requirements of in-demand datacenters that are deployed with the knowledge that they will be heavily used to perform computing-intensive operations that generate heat at capacity and that must be cooled on demand.

In at least one embodiment, a fastening system for manifolds to racks of a datacenter is disclosed to address one or all of the above-referenced shortcomings and requirements of present datacenters. The datacenters may have existing racks that require the manifold to be installed in a specific manner. In at least one embodiment, each of the existing racks may have a bracket associated thereon to receive one or more of the intermediate features of the cooling system. The bracket may be an existing power distribution unit (PDU) bracket (or a PDU mounting bracket). A manifold may be adapted to suit the bracket existing on the racks. In at least one embodiment, the fastening system for an existing rack includes an adapter plate that is associated with the manifold and that has holes to receive buttons in configurable positions, which enable the buttons to mate with keyholes of a bracket of the rack in order to fasten the manifold to the bracket. In at least one embodiment, a bracket is provided as part of a fastening system, and enables the same adapter plate with holes in the configurable positions to receive buttons that are affixed to the keyholes of the bracket depending on the requirements for an associated manifold to be held in place. In at least one embodiment, the PDU bracket, if used, may be on the legacy rack and the buttons are adapted in their configurable positions to mate with existing keyholes on the PDU bracket.

In at least one embodiment, racks may be purchased from a supplier but may be supplied without brackets for the rack manifolds. The bracket may be assembled to the rack at the time of installation. Thereafter, the rack manifolds having the fastening system may be mated with the brackets to complete part of the installation of the cooling system so that coolant may circulate through the rack manifold and servers therein. In at least one embodiment, a rack may be supplied without matching holes (or patterns of holes), with which to match and affix a PDU bracket. Furthermore, a supplier may not have PDU brackets to affix to the rack prior to delivering the rack; or a supplier may only have racks or PDU brackets that may be mounted on (or allow affixing to) one side of the racks. This makes the racks or the brackets non-interchangeable. Other differences in the racks or the brackets may include a lack of keyholes (also referred to as slots), different spacing between the keyholes, a lack of cage nut holes to provide optional locks for the rack manifold to the brackets, or differently-sized cage nut squares which may also have different spacing there between In at least one embodiment, the legacy rack and brackets may not have screw holes for attaching the bracket to the rack. The screw holes may be required by drilling into a blank PDU bracket. In at least one embodiment, the screw holes may be in different positions on the bracket relative to screw holes on the rack. The screw holes may be drilled in a manner to ensure that the keyholes are available to attach the rack manifold, with the rack manifold aligned to couple to adapters, for instance, between a row manifold and the rack manifold.

Datacenters may benefit from additional equipment to address shortcomings, but may require that no equipment is to be removed, for security clearance reasons. As such, removal of a rack manifold from a datacenter may be subject to third party security clearance. The ability to adapt any rack manifold to the bracket that is either existing in the form of a PDU bracket or is added in the form of an adjusted PDU bracket, may suit the requirements of the datacenter from a security clearance perspective. In at least one embodiment, the present disclosure provides a complete kit having different (such as a minimum number) of adapters, so that datacenter technicians performing installation, maintenance, or repair, may be able to discard extra parts of the kit that are not required, without having to remove them from the datacenter. The present disclosure enables economical use of components, in at least one embodiment. Without one or more adapters from the kit, the entire rack manifold may need to be taken out of the data center and reworked, causing significant downtime for replacement of the rack manifold, a bracket, or any other associated component for the rack-level cooling features.

In at least one embodiment, a keyhole is in reference to a hole that is shaped to have at least one broad opening and at least one narrow opening. In at least one embodiment, keyholes may, therefore, have two or more narrow openings and a broad opening. FIG. 3C illustrates an example keyhole having keyhole features. The narrow openings, in at least one embodiment, are on either side of the broad opening.

The fastening system of at least the adapter plate having buttons and optionally of the bracket having keyholes, in at least one embodiment, is a ready-to-use solution for new and existing datacenters. This enables an existing bracket to be used to couple a manifold to rack or enables a newly purposed bracket for the adapter plate of the present disclosure may be used. As manifolds may weight approximately 50 pounds (lbs) when pre-loaded with the requisite coolant for installation with the rack and as space is limited in a densely packed datacenter, the present disclosure provides a solution to enable hanging a pre-loaded manifold on a bracket by an individual in the limited space. The solution includes specific points of attachment between the manifold and the bracket, without a requirement for multiple screw-type fasteners that need to be aligned, along with the manifold itself that needs to be aligned and held in place. In at least one embodiment, legacy racks may be air-cooled racks that may not be designed to accommodate liquid cooling. In addition, shorter racks having 1000 mm depth or less may not be able to support the intermediate features of a liquid cooling system, but may be adapted using the features of the present disclosure.

In at least one embodiment, the present disclosure enables tool-less installation of a manifold for a liquid cooling rack. In at least one embodiment, the tool-less installation is supported by using buttons to be fitted within keyholes of a bracket. The buttons are affixed to an adapter plate on its one surface and a second surface is affixed to the manifold. The adapter plate enables a hanger-type design to support installation of the manifold to the rack. Further, a positive lock screw feature may be provided between the adapter plate and the bracket for shock and vibration protection (such as according to standards defined in Telcordia® NEBS GR-63-CORE). In at least one embodiment the adapter plate has configurable positions to accept the buttons, which enables rack alignment and installation by an individual. For instance, a team member may not be required to hold and align the manifold, while a second team member fastens the manifold at various locations to the bracket because the buttons are positioned on the adapter plate to align with one or more keyholes on the bracket. When the adapter plate is affixed to the manifold, the manifold is easily hung in place by the individual. In at least one embodiment, the rack mount locking features, such as the aforementioned positive lock screw feature prevents damage to the manifold during transportation and in the event of tremors, such as during earthquakes.

FIG. 1 is a block diagram of an example datacenter 100 having a cooling system subject to improvements described in at least one embodiment. The datacenter 100 may be one or more rooms 102 having racks 110 and auxiliary equipment to house one or more servers on one or more server trays. The datacenter 100 is supported by a cooling tower 104 located external to the datacenter 100. The cooling tower 104 dissipates heat from within the datacenter 100 by acting on a primary cooling loop 106. Further, a cooling distribution unit (CDU) 112 is used between the primary cooling loop 106 and a second or secondary cooling loop 108 to enable extraction of the heat from the second or secondary cooling loop 108 to the primary cooling loop 106. The secondary cooling loop 108 is able to access various plumbing all the way into the server tray as required, in an aspect. The loops 106, 108 are illustrated as line drawings, but a person of ordinary skill would recognize that one or more plumbing features may be used. In an instance, flexible polyvinyl chloride (PVC) pipes may be used along with associated plumbing to move the fluid along in each of the loops 106, 108. One or more coolant pumps, in at least one embodiment, may be used to maintain pressure differences within the loops 106, 108 to enable the movement of the coolant according to temperature sensors in various locations, including in the room, in one or more racks 110, and/or in server boxes or server trays within the racks 110.

In at least one embodiment, the coolant in the primary cooling loop 106 and in the secondary cooling loop 108 may be at least water and an additive, for instance, ethylene glycol or propylene glycol. In operation, each of the primary and the secondary cooling loops has their own coolant. In an aspect, the coolant in the secondary cooling loops may be proprietary to requirements of the components in the server tray or racks 110. The room or row-level CDU 112 is capable of sophisticated control of the coolants, independently or concurrently, in the loops 106, 108. For instance, the CDU may be adapted to control the flow rate so that the coolant(s) is appropriately distributed to extract heat generated within the racks 110. Further, flexible tubing 114 is provided from the secondary cooling loop 108 to enter each server tray and to provide coolant to the electrical and/or computing components. In the present disclosure, the electrical and/or computing components are used interchangeably to refer to the heat-generating components that benefit from the present datacenter cooling system. The tubing 118 that form part of the secondary cooling loop 108 may be referred to as room manifolds. Separately, the tubing 116 extending from tubing 118 may also be part of the secondary cooling loop 108 but may be referred to as row manifolds. The tubing 114 enters the racks as part of the secondary cooling loop 108, but may be referred to as rack cooling manifold. Further, the tubing 116 (e.g., row manifolds) extend to all racks along a row in the datacenter 100. The plumbing of the secondary cooling loop 108, including the tubing 118 (e.g., room manifolds), tubing 116 (e.g., row manifolds), and tubing 114 (e.g., rack cooling manifold) may be improved by at least one embodiment of the present disclosure. An optional chiller 120 may be provided in the primary cooling loop within datacenter 100 to support cooling before the cooling tower. To the extent additional loops exist in the primary control loop, a person of ordinary skill would recognize reading the present disclosure that the additional loops provide cooling external to the rack and external to the secondary cooling loop; and may be taken together with the primary cooling loop for this disclosure.

In at least one embodiment, in operation, heat generated within server trays of the racks 110 may be transferred to a coolant exiting the racks 110 via flexible tubing 114 (e.g., of the rack cooling manifold) of the second cooling loop 108. Pertinently, second coolant (in the secondary cooling loop 108) from the CDU 112, for cooling the racks 110, moves towards the racks 110. The second coolant from the CDU 112 passes from one side of the room manifold having tubing 118, to one side of the rack 110 via tubing 116 (e.g., row manifold), and through one side of the server tray via tubing 114. Spent second coolant (also referred to as secondary return coolant or exiting second coolant) carries the heat from the computing components and exits out of another side of the server tray (such as, enter left side of the rack and exits right side of the rack for the server tray after looping through the server tray or through components on the server tray). The spent second coolant that exits the server tray or the rack 110 comes out of different side (such as, exiting side) of tubing 114 and moves to a parallel, but also exiting side of the tubing 116 (e.g., row manifold) [116]. From the tubing 116 (e.g., row manifold), the spent second coolant moves in a parallel portion of the tubing 118 (e.g., room manifold) going in the opposite direction than the incoming second coolant (which may also be the renewed second coolant), and towards the CDU 112.

In at least one embodiment, in operation, heat generated within server trays of the racks 110 may be transferred to a coolant exiting the racks 110 via flexible tubing of the row manifold 114 of the second cooling loop 108. Pertinently, second coolant (in the secondary cooling loop 108) from the CDU 112, for cooling the racks 110, moves towards the racks 110. The second coolant from the CDU 112 passes from one side of the room manifold having tubing 118, to one side of the rack 110 via row manifold 116, and through one side of the server tray via tubing 114. Spent second coolant (also referred to as secondary return coolant or exiting second coolant) carries the heat from the computing components and exits out of another side of the server tray (such as, enter left side of the rack and exits right side of the rack for the server tray after looping through the server tray or through components on the server tray). The spent second coolant that exits the server tray or the rack 110 comes out of different side (such as, exiting side) of tubing 114 and moves to a parallel, but also exiting side of the row manifold 116. From the row manifold 116, the spent second coolant moves in a parallel portion of the room manifold 118 going in the opposite direction than the incoming second coolant (which may also be the renewed second coolant), and towards the CDU 112.

In at least one embodiment, the spent second coolant exchanges its heat with a primary coolant (supply coolant) in the primary cooling loop 106 via the CDU 112. The spent second coolant is renewed (such as, relatively cooled when compared to the temperature at the spent second coolant stage) and ready to be cycled back to through the second cooling loop 108 to the computing components. Various flow and temperature control features in the CDU 112 enable control of the heat exchanged from the spent second coolant or the flow of the second coolant in and out of the CDU 112. CDU 112 is also able to control a flow of the primary coolant in primary cooling loop 106. As such, it is possible that some components within the servers and the racks do not receive the level of coolant required as the second or secondary loop generally provides coolant at its default temperature properties based in part on the temperature sensors that may be in the servers and the racks. Further, additional cooling loops may be provided to exchange heat with the secondary cooling loop, but are subject to similar restrictions by usage of a coolant as in the case of the primary or the secondary cooling loop.

Figure 2A:
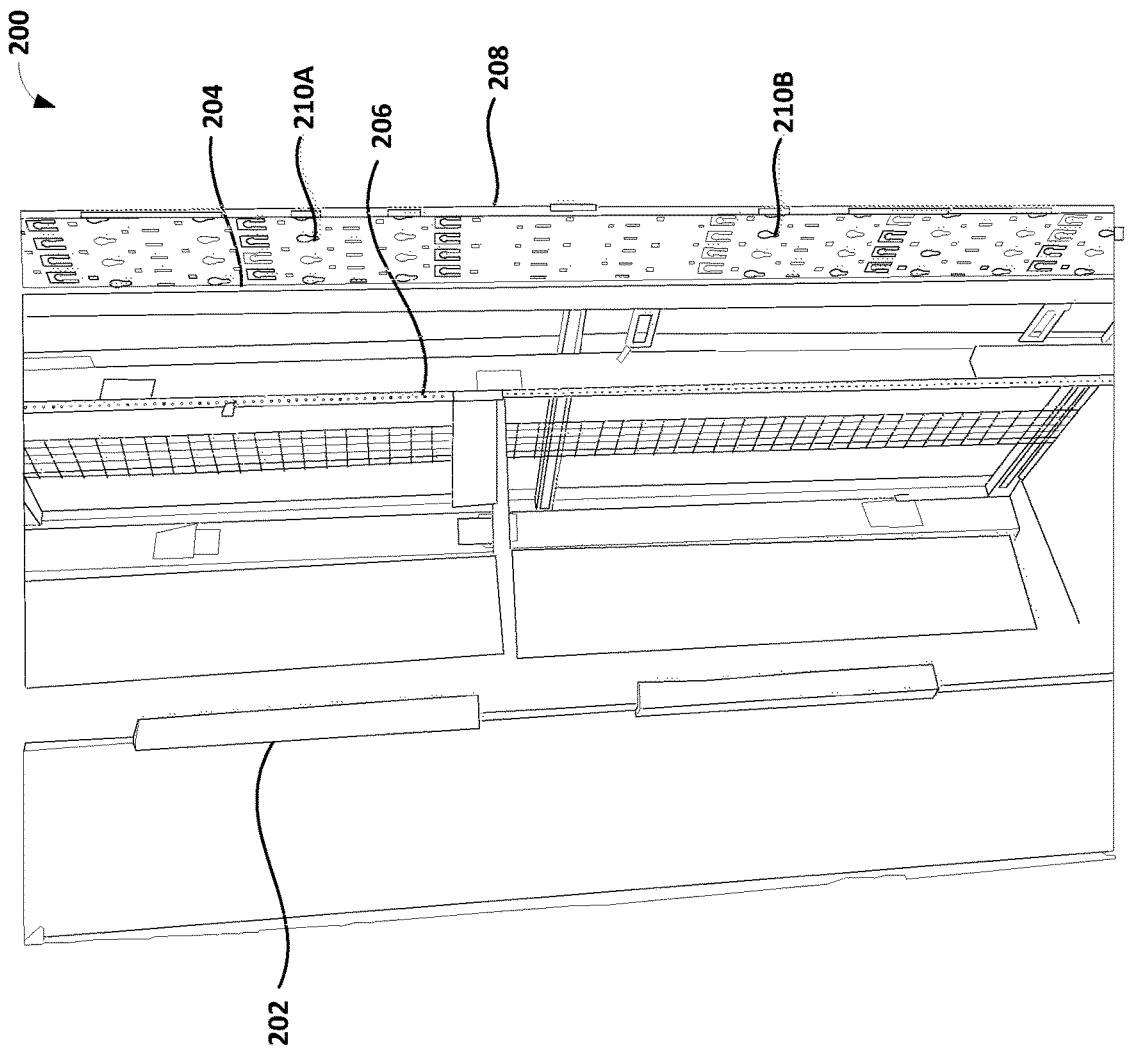
FIG. 2A is an example rack illustrating bracket features that benefits from a fastening system for fastening a manifold to the rack, in accordance with at least one embodiment.
Figure 2B:
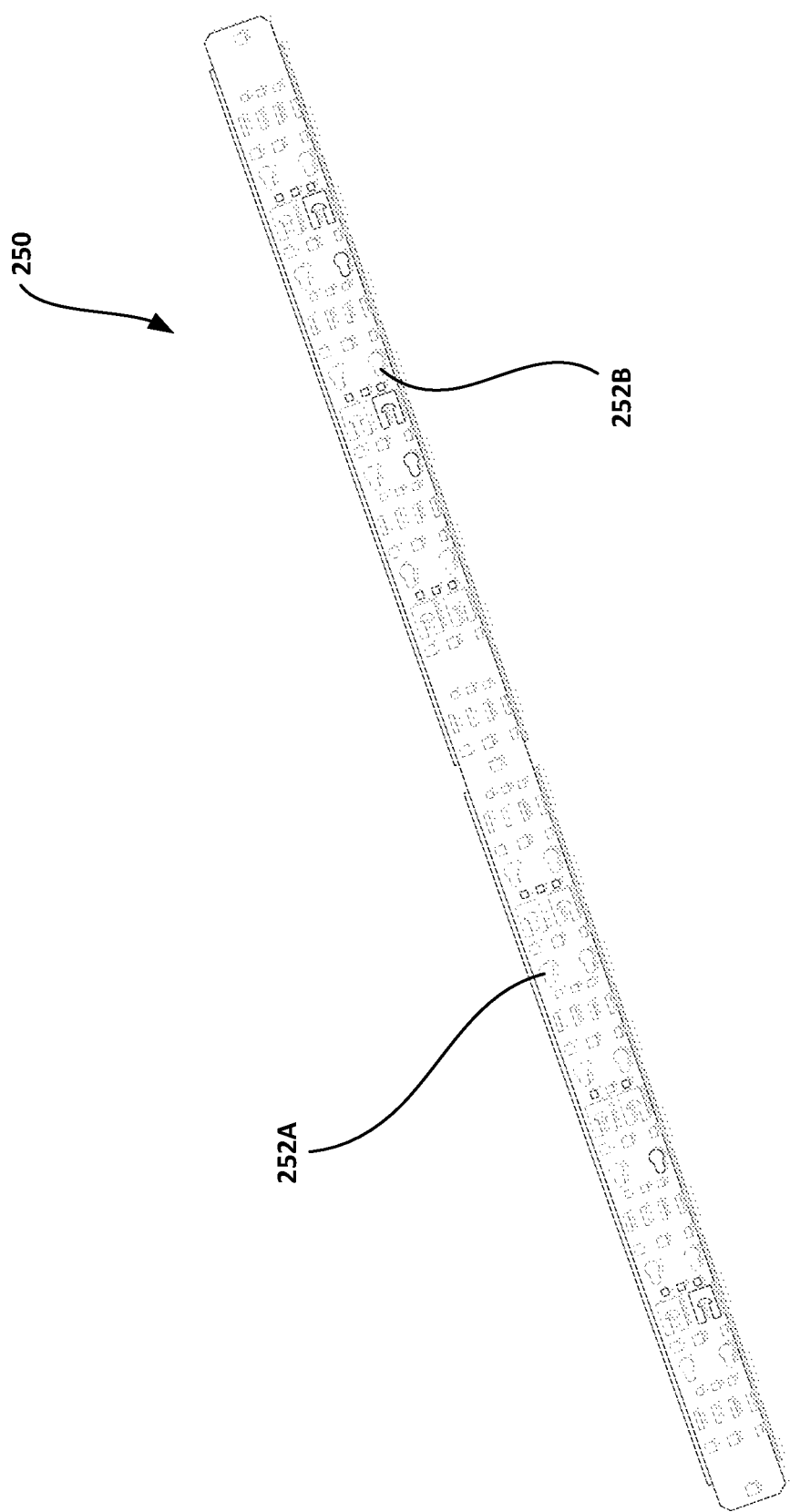
FIG. 2B is an example bracket for fastening a manifold to a rack, in accordance with at least one embodiment.

FIG. 2A is an example rack 200 illustrating bracket features that benefits from a fastening system for fastening a manifold to the rack, in accordance with at least one embodiment. The rack may be a rack within datacenter 100 or may be a rack mounted in a container of a mobile datacenter. The rack includes supporting sides 202, 204, and multiple positions 206 on the rack for mounting server trays, for instance. One or more brackets 208 may be mounted with the rack 200 either by sliding each of the one or more brackets within one or more rails provided at the end of the support sides 202, 204, or by screwing the brackets to the support sides 202, 204 are provided locations on the brackets and the support sides 202, 204. In at least one embodiment, the brackets 208 may be provided on either side of the rack 200. In at least one embodiment, the bracket may be an existing bracket having keyholes 210A, 210B that may be used with the adapted plates of the present disclosure to hang one or more manifolds on the rack 200. FIG. 2B is an example bracket 250 for fastening a manifold to a rack, in accordance with at least one embodiment. In at least one embodiment, the example bracket 250 is a newly purposed bracket for the adapter plate of the present disclosure may be used. The keyholes 252A, 252B are designed for default configurable positions of buttons on an adapter plate. In at least one embodiment, the bracket 250 has keyholes in accordance (entirely or partly) with a standard, such as requiring a width of about 2.2", which may be to the standard, and a height that is ½ scale at about 6.125", instead of 12.25" per the standard. In at least one embodiment, the standard is associated with the PDU bracket.

Figure 3A:
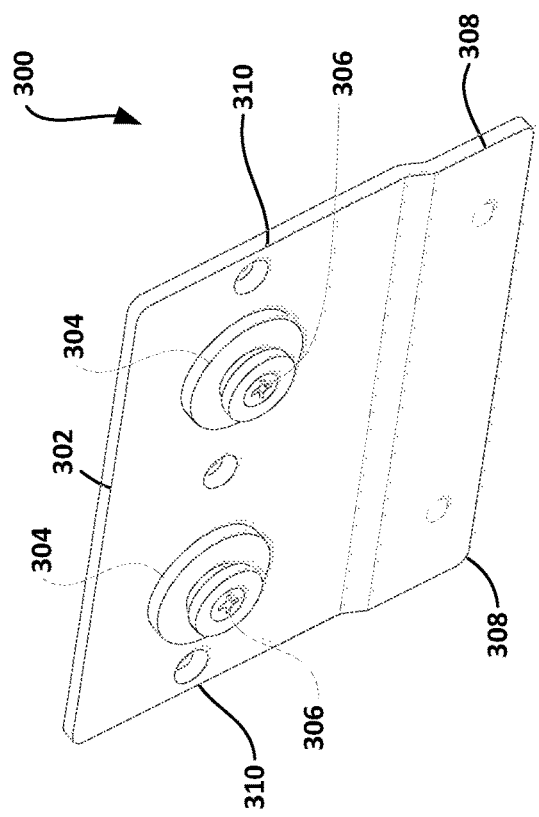
FIG. 3A is an example adapter plate and associated buttons for a fastening system for fastening a manifold to the rack, in accordance with at least one embodiment.
Figure 4A:
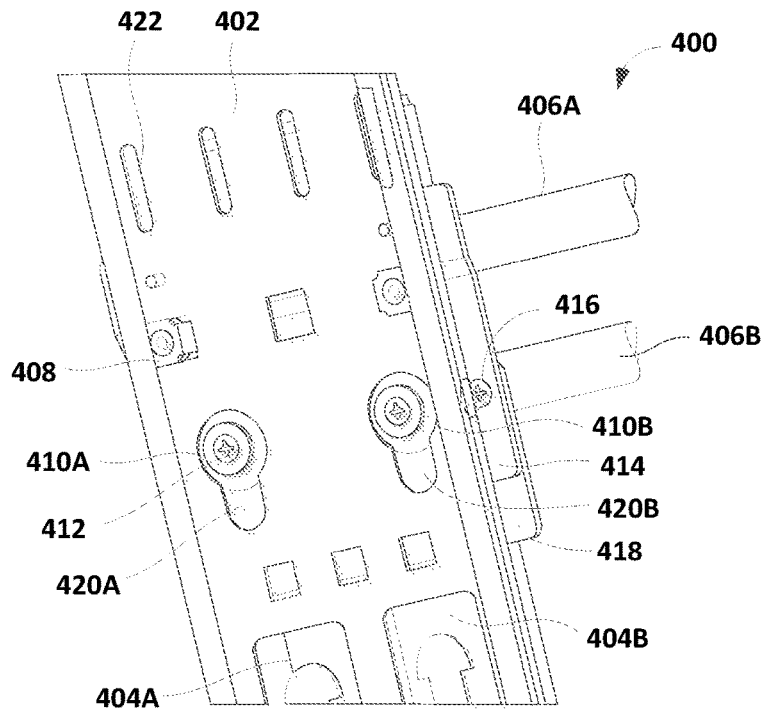
FIGS. 4A and 4B illustrate features of a fastening system for fastening one or more manifolds to a rack, in accordance with at least one embodiment.
Figure 4B:
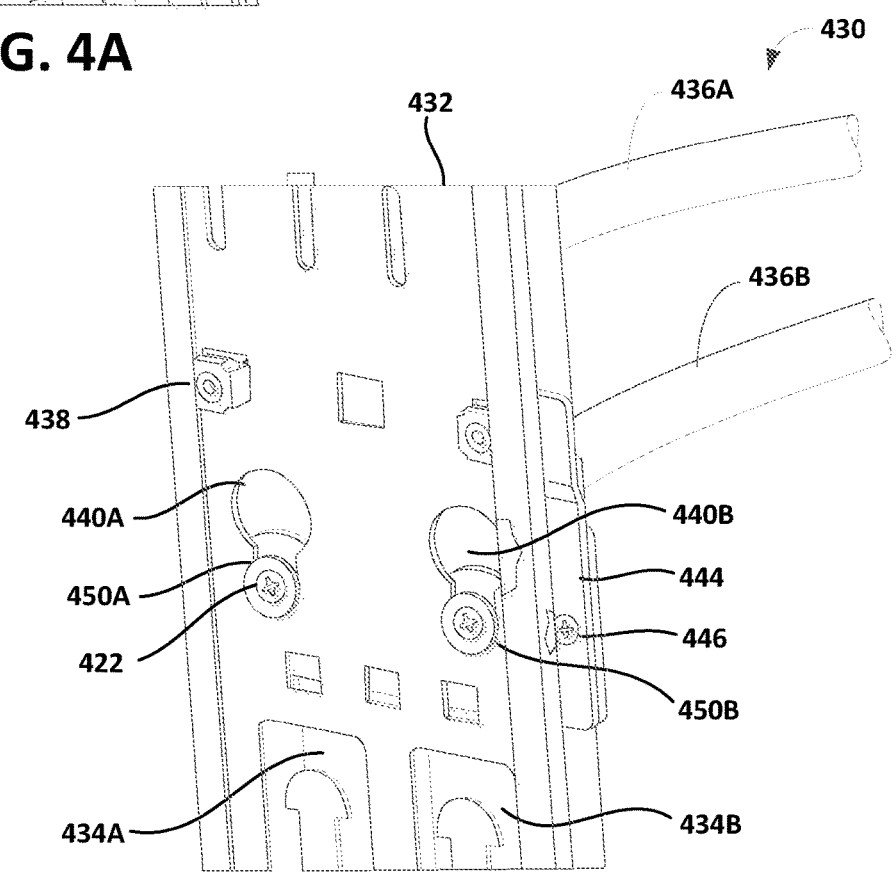

FIG. 3A is an example adapter plate 300 and associated buttons 304 for a fastening system for fastening a manifold to the rack, in accordance with at least one embodiment. In at least one embodiment, one more buttons 304 and their associated features 306 (e.g., screws) may be sufficient to mate the adapter plate 300 (having a rack manifold) to the bracket. As such, in at least one embodiment, only one button 304 may be provided on each adapter plate 300 to mate a manifold with a bracket of a rack. In at least one embodiment, the adapter plate 300 is for fastening a manifold to a bracket of a rack by, in part, affixing or fastening buttons to one side or surface of the adapter plate 300 and affixing or fastening the manifold to the second side or surface of the adapter plate 300. The adapter plate 300 has associated therewith screw (or threaded) holes, such as the holes have the buttons 304 affixed via features 306 (e.g., screws), installed therein in different locations or positions on the adapter plate 300. In at least one embodiment, the buttons are affixed or fastened to the one side or surface of the adapter plate 300 via the features 306 (e.g., screws) into the screw holes provided. The holes 302, 310 may be provided to enable associating the adapter plate 300 with a bridge plate, such as illustrated in FIGS. 4A and 4B. In at least one embodiment, the screw holes for affixing buttons 304 may be in different locations or positions on the adapter plate 300 to enable the adapter plate 300 to receive one or more buttons in different configurable positions. The configurable positions are to enable the buttons to mate with keyholes of the bracket of the rack in order to fasten the manifold to the bracket.

In at least one embodiment, the adapter plate 300 includes the second holes 310, which like holes 302 are through-holes, to enable fastening of the adapter plate 300 to the bridge plate. The bridge plate is welded (or fastened in other manners) to the rack manifold. In at least one embodiment, the bridge plate is an addition to the manifold to enable the fastening of the adapter plate 300 to the manifold. The bridge plate may be welded to the manifold, as noted, but other manners of affixing the bridge plate to the manifold will be apparent upon reading this disclosure. In at least one embodiment, the adapter plate 300 is directly affixed or fastened to the manifold, provided the manifold has corresponding receiving holes, such as threaded holes to receive the adapter plate 300.

In at least one embodiment, the adapter plate 300 includes third holes 308 to enable fastening of the adapter plate to cage nuts of the bracket. In at least one embodiment, the fastening of the adapter plate to the bracket with the cage nuts enable protection of the manifolds in mobile datacenter, during transportation, but also enable protection of the manifolds from tremors due to earthquakes or other natural or man-made disturbances. The cage nuts (and respective cage nut holes), in at least one embodiment, are ½" sized, square cage nuts. In at least one embodiment, the provision of the third holds 308 enables stand-alone affixing of the bridge plate to a bracket using the cage nuts, and without a need for the buttons.

Figure 3B:
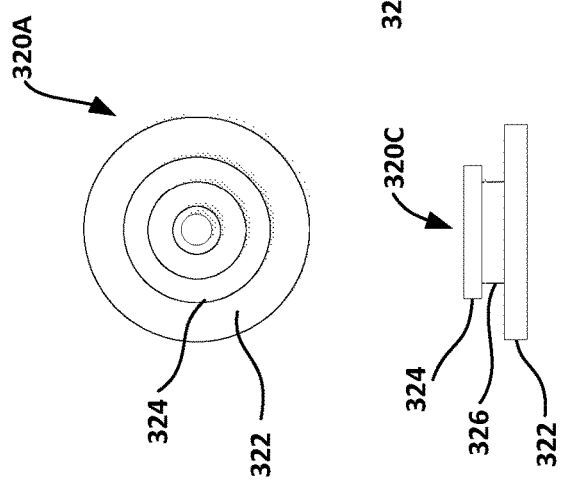
FIG. 3B illustrates different views and dimensions for a button to be used with an adapter plate for fastening a manifold to the rack, in accordance with at least one embodiment.

FIG. 3B is different views 320A (plan), 320B (perspective), 320C (side or elevation) and dimensions for a button to be used with an adapter plate for fastening a manifold to the rack, in accordance with at least one embodiment. In at least one embodiment, each of the buttons 304 includes at least two flanges. This is further illustrated in views 320A, 320C. The at least two flanges 322, 324 are separated by a neck 326. There is a central recess 328 to receive a fastener, such as fastener 306 to fasten the individual button 304 to the adapter plate 300 at an individual screwed or threaded hole provided on the adapter plate 300 and that is aligned with the central recess 328 that is through the individual button 304.

In at least one embodiment, each of individual flanges 322, 324 of the at least two flanges have a determined diameter. As such, a button for use with the adapter plate, on a specific bracket may be selected from many available buttons manufactured for use with the adapter plate. The available buttons all have different diameters for respective ones of individual flanges on the many available buttons. In at least one embodiment, an internal diameter of a smaller flange 324 of the two flanges on an individual button is 15 millimeters (mm) or 0.59 inches. In at least one embodiment, an internal diameter of a larger flange 322 of the two flanges on an individual button is 25 mm or 0.98 inches. In at least one embodiment, an internal diameter of the central recess 328 on an individual button is 15 mm or 0.59 inches. In at least one embodiment, the central recess 328 has a core diameter or 4.3 mm or 0.17 inches and a surface diameter of 11.8 mm or 0.46 inches to support a fastener 306 that is a recessed fastener. In at least one embodiment, a thickness of the smaller flange 324 of the two flanges on an individual button is 2 mm or 0.08 inches. In at least one embodiment, a thickness of the larger flange 322 of the two flanges on an individual button is 2.5 mm or 0.10 inches. In at least one embodiment, the fastener 306 is a screw with a conical neck and a flat head.

Figure 3D:
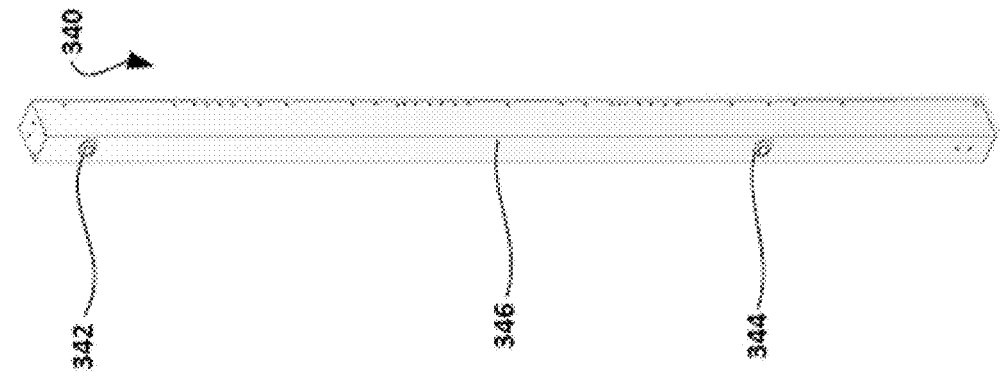
FIGS. 3C, 3D, and 3E illustrate features for a fastening system for fastening a manifold to a rack, in accordance with at least one embodiment.
Figure 3E:
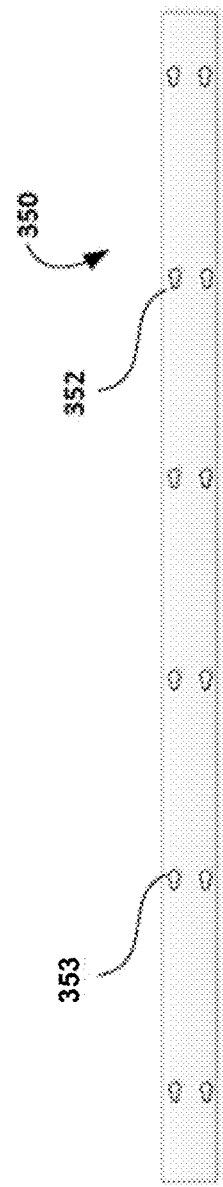
Figure 3C:
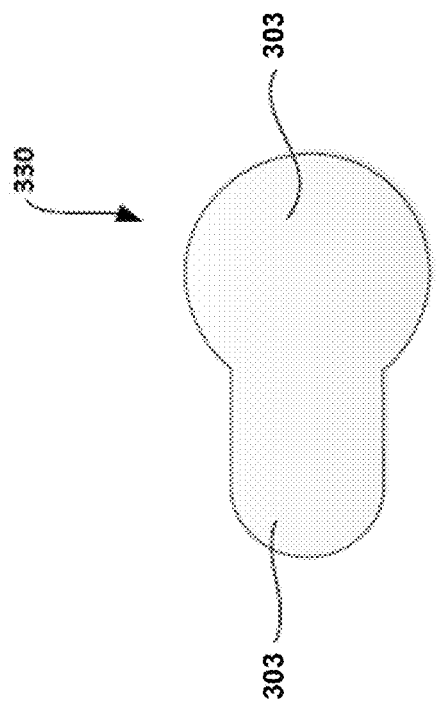

In at least one embodiment the neck 326 has a length of 2.4 mm or 0.09 inches to bridge the gap between the smaller and the large flange. The neck length also translates to a thickness of the bracket being less than 2.4 mm to enable the button to sit in a keyhole of the bracket. In at least one embodiment, the different available buttons may have different neck lengths, along with the diameters and thicknesses of the flanges. This enables the use of the different buttons to suit different applications, such as manifolds of higher weight than. In at least one embodiment, the neck 326 is conical to support easy insertion and removal during hanging of the manifold. In at least one embodiment, a one button minimum requirement may be adopted for the present adapter plate to support static weight of the rack manifold to the installed. In at least one embodiment, two buttons per bracket may be designated for heavier weights of the rack manifolds, such as dependent on the pre-filled coolant density. In at least one embodiment, a limit to the most number of buttons allowed for a rack manifold may be adopted as 4 buttons per manifold to support dynamic loading that may exist on the manifold and the brackets. In at least one embodiment, the dynamic loading may be from natural or human circumstances, including from an earthquake. In at least one embodiment, two lock screws may be provided form the rack manifold to the bracket via the adapter plates, to meet the NEB S (Network Equipment-Building System) standard requirements FIGS. 3C, 3D, and 3E illustrate features 330, 340, 350 for a fastening system for fastening a manifold to a rack, in accordance with at least one embodiment. In at least one embodiment, buttons are selected based in part on dimensions of the buttons that can mate with a keyhole of a feature 330 of the fastening system that is on a bracket of a rack. The keyhole feature 330 has at least one broad opening or feature 303 (e.g., hole 302) to support mating of the smaller diameter of a button, such as the button 304. Once mated, the button sides down a narrow opening or feature 303 (e.g., hole 302) of the keyhole feature 330 to be held in place. Multiple buttons may be fit simultaneously with multiple aligned keyholes in a similar manner or one button mating within one keyhole may be sufficient to fasten the button within a narrow feature of the individual keyhole, and in turn, to fasten the manifold associated with the button (via the adapter plate) to the bracket of the rack. In at least one embodiment, screwed or threaded holes, other than the holes to which the illustrated buttons 304 are presently screwed, may be provided on the adapter plate 300 in FIG. 3A, with spacing there between, to form configurable positions that are adapted to align the adapter plate 300 to keyholes of a bracket. In at least one embodiment, the adapter plate 300 may have either, both buttons 304 installed or a single button 304 installed, the underlying screwed or threaded holes supporting at least two configurable positions for receiving the buttons 304. This allows for determination of the holding requirements for the manifold and available keyholes on a bracket, and an alignment of the adapter plate to the available keyholes using the buttons, which are then fastened to the manifold so that manifold being associated with the adapter plate may be hung on the bracket in the alignment determined for the adapter and keyholes of the bracket.

In at least one embodiment, manifold features 340 include a manifold 346 that is adapted to include one or more buttons 342, 344 affixed (such as by welding) to the manifold, directly, to enable mounting the manifold 346 to a bracket. In at least one embodiment, the positions of the buttons 342, 344 are determined to enable stable mounting of the manifold without an adapter plate. In at least one embodiment, one or more adapter plates 300 may be affixed (such as by welding) directly the manifold 346 at respective locations, such as where the buttons 342, 344 are presently affixed. In at least one embodiment, a determination to use or not use a bridge plate between the adapter plate 300 and the manifold is dependent in part on whether hole locations are consistent between a deployed rack, mounting locations (such as, for a PDU or other manifolds) are available on a bracket, and mounting locations on a manifold to be mounted on the deployed rack. In at least one embodiment, bracket features 350 of a proprietary fastening system may include a bracket 352 of the bracket features 350 having keyholes 353 to support installation of the adapter plate having associated buttons on one surface to match the keyholes 353 and having the manifold on its other surface. As such, the many variations enable an adaptable manifold for datacenter racks by selecting an appropriate mounting bracket, an appropriate adapter plate, and an appropriate one or more buttons that are each or altogether sized according to dimensions of keyhole(s) available for hanging the racks, the stability required for the manifold, and holes available to associate the bracket and the rack. In at least one embodiment, selection of an appropriate number of buttons enable strength and stability to the hung manifolds.

FIGS. 4A and 4B illustrate features of a fastening system 400; 430 for fastening one or more manifolds 404A, 404B to the rack via a bracket 402 that is associated with the rack, in accordance with at least one embodiment. In at least one embodiment, the system 400; 430 includes a bracket 402 having keyholes 420A, 420B to receive buttons 410A, 410B. The bracket 402 is adapted to be coupled to a rack either by affixing bracket 402 within rails (such as U-channels containing t-nuts) at a top and a bottom of the bracket 402, and by use of a screw within a hole of the bracket (such as hole 470 in FIG. 4C). The bracket 402 is therefore associated with rails of at least one side support feature of the rack or by screwing the bracket 402 to the rack via a screw feature 422 on the bracket. In at least one embodiment, an adapter plate 414 is associated with one or more manifolds 404A, 404B (illustrated in a rear view of the manifolds) via one or more screws (one is illustrated by reference numeral 416) through an available hole in the adapter plate 414, such as a hole available for the buttons, but not in use (see the at least one embodiment in FIG. 3A and its related discussion). In at least one embodiment, a minimum of two screw holes and two associated screws (such as a screw 416) are utilized to associate the adapter plate 414 to the one or more manifolds 404A, 404B. The adapter plate 414 has second holes (such as screw or threaded holes into which screw 412; 422 is fastened) to fasten the buttons 410A, 410B in configurable positions on the adapter plate as discussed with reference to the at least one embodiment in FIG. 3A. The configurable positions enable the buttons 410A, 410B to mate with keyholes 420A, 420B of the bracket 402 in order to fasten the one or more manifolds 404A, 404B to the rack.

In at least one embodiment, third holes (see the at least one embodiment in FIG. 3A and its related discussion) on the adapter plate 414 enable fastening of the adapter plate to cage nuts 408 of the bracket 402. In at least one embodiment, the present fastening system enables alignment of the one or more manifolds 404A, 404B with rack-level piping (such as, at a bottom of the manifold), and associated valves or pump assemblies by an individual installer. In at least one embodiment, the rack-level piping associates the one or more manifolds 404A, 404B with row-level manifolds of the datacenter. In at least one embodiment, server-level piping 406A, 406B is provided from the manifolds 404A, 404B to circulate coolant to individual server or components. A determination may be made for how the buttons 410A, 410B are to be used and how the holes in the adapter plate 414 are to be used for the buttons, based in part on the spacing of the keyholes 420A, 420B on the bracket 402 and based in part on the weight of the one or more manifolds 404A, 404B to be held up by the buttons. An installer then affixes or fastens the buttons 410A, 410B to the determined holes of the manifold or on the adapter plate 414. The adapter plate 414 is then affixed or fastened to the one or more manifolds 404A, 404B via available holes on the adapter plate 414 and via the optional bridge plate 418. The one or more manifolds 404A, 404B are then hung on the bracket 402 by mating smaller flanges of the buttons 410A, 410B with the keyholes 420A, 420B, and letting the buttons slide down into a narrow section or feature of the keyhole, as illustrated by a locked position of the buttons 450A, 450B in keyholes 440A, 440B, of FIG. 4B. The bracket 402, 432 is illustrated without a rack, but is understood as attached or affixed to a rack, prior to the manifolds being hung on the bracket.

In at least one embodiment, the system 400 may include a bridge plate 418 that is fixedly coupled with the manifold on a first surface and that is releasably coupled with the adapter plate 414 on a second surface. The fixed coupling of the bridge plate 418 with the manifold may be by a welded connection. The releasable coupling between the adapter plate 414 and the bridge plate 418 is by a screw, such as screw 416. In at least one embodiment, the screw 416 is a hole that is screwed or threaded, and that is meant for a configurable position of the buttons 410A, 410B, or is a dedicated hole on the adapter plate 414 to enable fastening of the adapter plate 414 to the one or more manifolds 404A, 404B (with the optional bridge plate 418 in between). As such, the adapter plate 414 and the bridge plate 418 may be adapted to support more than one manifold.

In at least one embodiment, while system 430 illustrates a locked position for the manifold with the rack, because the buttons 450A, 450B are in narrow features of the keyholes 440A, 440B, it also possible to associate the adapter plate 444 directly with a manifold by a welding between the two. The screw 446 may be inserted through an available one of the button holes or a dedicated hole of the adapter plate 444. In at least one embodiment, the bracket 432 of system 430 has keyholes 440A, 440B to receive buttons 450A, 450B. The bracket 432 is adapted to be coupled to a rack via rack mount rails (such as U-channels containing t-nuts) at the top and the bottom of the bracket, and by using screw location (e.g., hole 470). In at least one embodiment, an adapter plate 444 is associated with one or more manifolds 434A, 434B (illustrated in a rear view of the manifolds) via one or more screws (one is illustrated by reference numeral 446) through an available hole in the adapter plate 444. The adapter plate 444 has second holes fasten the buttons 450A, 450B in configurable positions on the adapter plate 444 as discussed with reference to the at least one embodiment in FIG. 3A. The configurable positions enable the buttons 450A, 450B to mate with keyholes 440A, 440B of the bracket 432 in order to fasten the one or more manifolds 434A, 434B to the rack.

In at least one embodiment, third holes (see the at least one embodiment in FIG. 3A and its related discussion) on the adapter plate 444 enable fastening of the adapter plate to cage nuts 438 of the bracket 432. In at least one embodiment, the present fastening system enables alignment of the one or more manifolds 434A, 434B with piping associated with row manifolds, and with associated valves or pump assemblies (such as under a platform supporting the racks), by an individual installer. A determination may be made as to how the buttons 450A, 450B are to be used and as to how the holes in the adapter plate 444 are to be used for the buttons, based in part on the spacing of the keyholes 440A, 440B on the bracket 432 and based in part on the weight of the one or more manifolds 434A, 434B to be held up by the buttons. The individual installer then affixes or fastens the buttons 450A, 450B to the determined holes of the adapter plate 444, affixes or fastens the adapter plate 444 to the one or more manifolds 434A, 434B via unused holes on the adapter plate 444, and then hangs the one or more manifolds 434A, 434B on the bracket by mating smaller flanges of the buttons 450A, 450B with the keyholes and letting the buttons slide down into a narrow section of the keyhole, as illustrated by a locked position of the buttons 450A, 450B in keyholes 440A, 440B. In at least one embodiment, the system 430 may not include a bridge plate that may be found in other systems, such as system 400 of FIG. 4A. The adapter plate 444 is releasably or fixedly coupled directly with the one or more manifolds 434A, 434B via a screw as illustrated in the at least one embodiment of FIG. 3D.

Figure 4C:
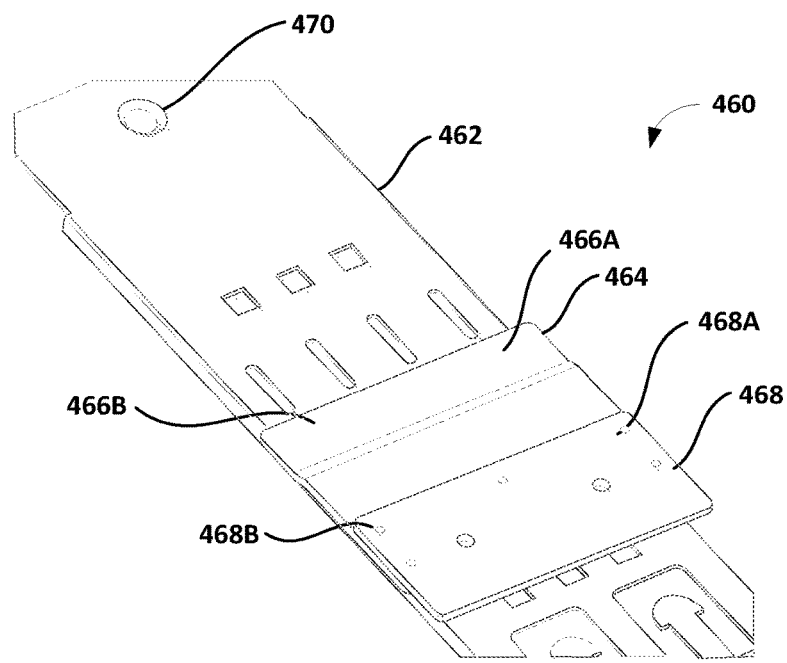
FIGS. 4C and 4D illustrate further features of a fastening system for fastening one or more manifolds to a rack, in accordance with at least one embodiment.
Figure 4D:
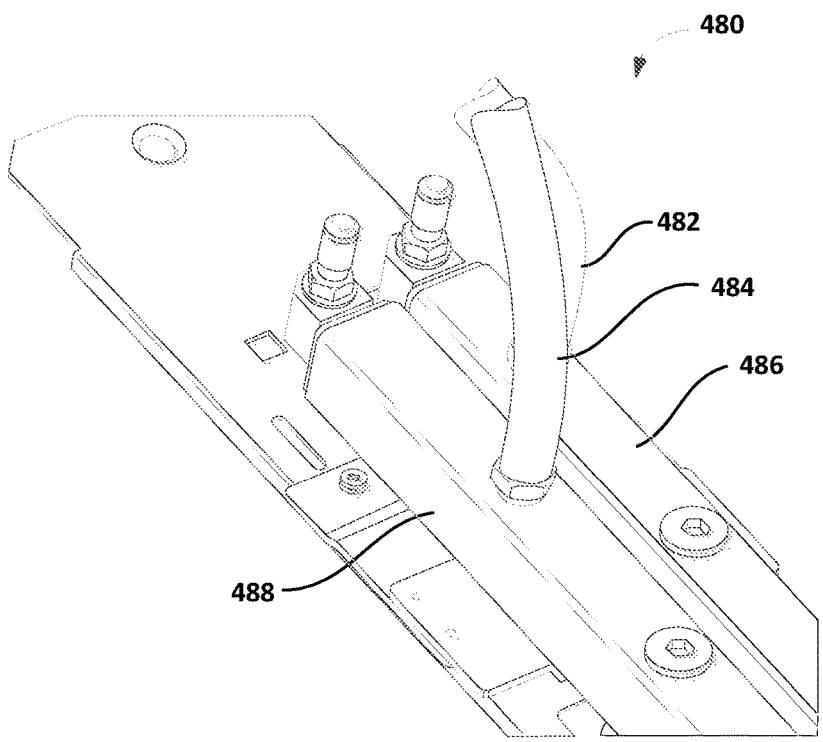

FIGS. 4C and 4D illustrate further features of a fastening system 460, 480 for fastening a manifold to the rack, in accordance with at least one embodiment. In at least one embodiment, the fastening system 460, 480 are front views of the system or systems 400; 430 of FIGS. 4A; 4B. In at least one embodiment, the fastening system may include a proprietary bracket 462 having holes 470 to associated the bracket 462 to a rack. Based in part on locations of keyholes on the bracket 462, an adapter plate 464 and associated buttons are determined. The buttons are affixed or fastened to the adapter plate 464 and the adapter plate is affixed or fastened to one or more manifolds with or without a bridge place depending on the availability of screw holes or other fastener features of the one or more manifolds.

In at least one embodiment, the adapter plate 464 may be further held in place via screws or other fasteners 466A, 466B. In at least one embodiment, the fasteners 466A, 466B are associated with cage nuts as discussed and illustrated with reference to FIGS. 4A, 4B. In at least one embodiment, this additional feature stabilizes the adapter plate 464 with the bracket 462 in the event of asserted external movement such as movement during transportation of a mobile datacenter incorporating the present disclosure or during an earthquake to a mobile or fixed datacenter. A bridge plate 468 may or may not be used with the adapter plate 464, depending on whether existing manifolds are adapted to be used with the adapter plate 464 or if a new manifold is designed and has holes to support an adapter plate 464 or the buttons, directly. As such, bridge plate 468 may include screw or other fastener holes 468A, 468B to enable fastening with the adapter plate 464 on one side and is welded to one or more manifolds on the illustrated side. In at least the one embodiment of FIG. 4C, the bridge plate 468 is illustrated without the welded-on manifold, while the at least one embodiment of FIG. 4D illustrates the bridge plate 468 with the welded-one manifolds 486, 488. FIG. 4D also illustrates the coupling pipes 482, 484, which may be flexible pipes, carrying coolant as part of a secondary cooling loop. Coolant destined to extract heat from server components travels from the manifold 486 to the coupling pipe 482, and to the server components, and returns back through the coupling pipe 484 and to the manifold 488. Further pipes leading to the manifold and exiting the manifolds are provided to carry the coolant to the CDU as discussed with reference to FIG. 1.

Figure 5:
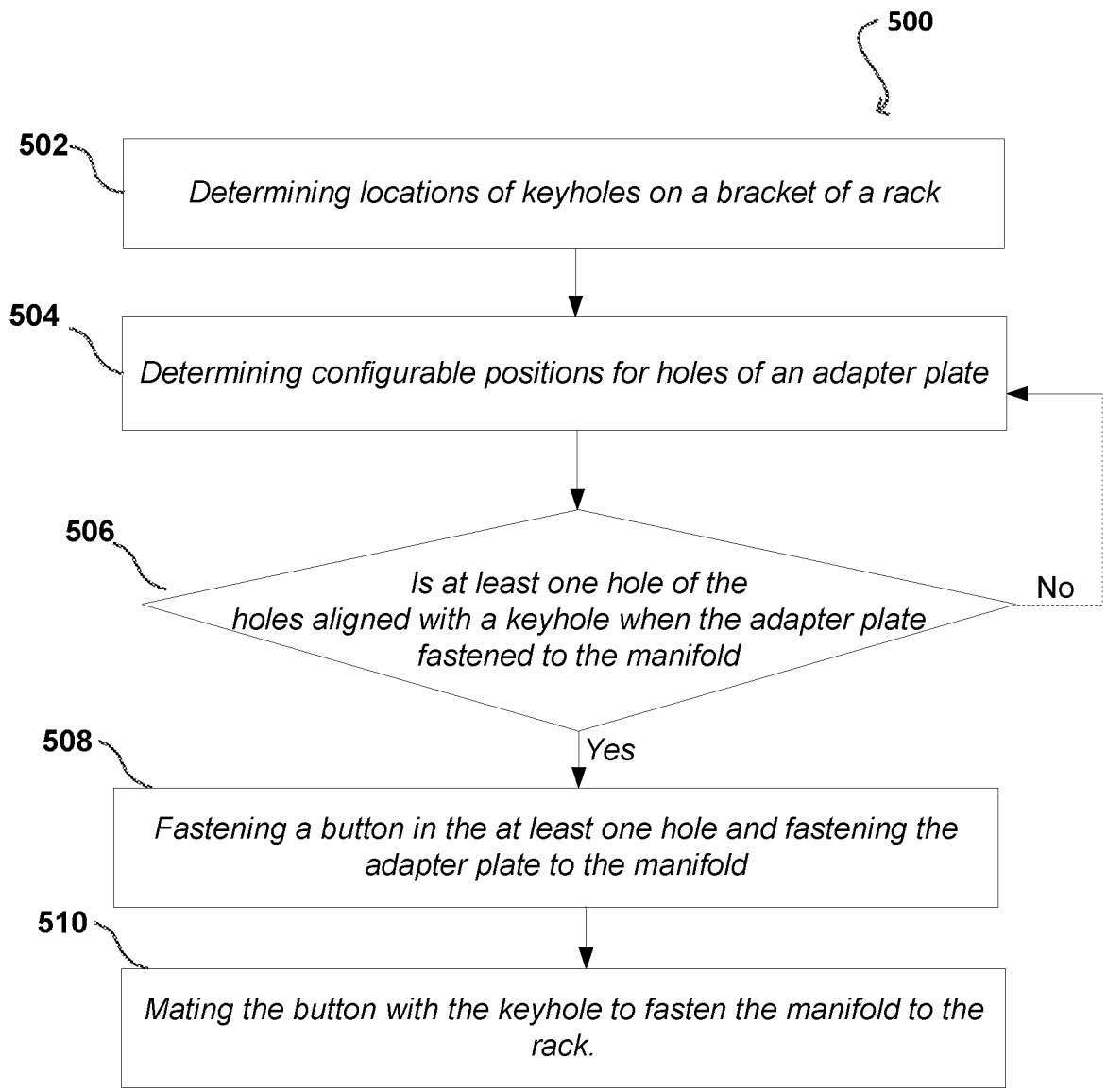
FIG. 5 is a process flow of steps available for a method of using or making a fastening system for fastening a manifold to the rack, such as a system in FIGS. 2A-4D, in accordance with at least one embodiment.

FIG. 5 is a process flow of steps available for a method 500 of using or making a fastening system for fastening a manifold to the rack, such as a system in FIGS. 2A-4D, in accordance with at least one embodiment. Step 502 of the method 500 determines locations of keyholes on a bracket of a rack. The bracket may be a proprietary bracket or an existing bracket. Step 504 determines configurable positions for holes of an adapter plate. In at least one embodiment, the holes of the adapter plate are selected to match broadest openings of the keyholes of the bracket. A determination or verification is made so that at least one hole of the holes of the adapter plate is aligned with a keyhole when the adapter plate is fastened to the manifold, via step 506. In at least one embodiment, a feature in step 504 ensures that the location of a keyhole resting position (a bottom of the narrow feature of the keyhole), once the button is mated, allows alignment of the manifold with valves connecting the manifold to a CDU of the cooling system. The determination or verification may be made by measuring spaces between the keyholes of the bracket and by applying the same measurement to the holes of the adapter plate. In addition, if multiple adapter plates are to be used, the determination or verification of step 506 also accounts for measurements between the adapter places and applying those measurements to select the appropriate adapter plate holes on each of the adapter plates.

In at least one embodiment, when an alignment is determined so that the holes on the adapter plate and the keyholes of the bracket matches, step 508 is performed for fastening a button in the at least one hole of the adapter plate, and for fastening the adapter plate to the manifold. Step 510 then enables mating the button with the keyhole to fasten the manifold to the rack. The mating may be a two-step process of inserting the button into the broadest part of the keyhole and, in a second step, letting the button slide into the narrowest part of the keyhole, thereby locking the button, the adapter plate, and the associated manifold of the adapter plate in position. In at least one embodiment, if an alignment is not determined or verified in step 506, a different configurable position of the configurable positions is selected; then one or more buttons are moved by unscrewing a screw holding the buttons onto the adapter plate, and by screwing the one or more buttons into a different location of the adapter plate. Then the adapter plate may be test fitted with the PDU mounting bracket, and finally secured onto the manifold prior to hanging the manifold. A further step in method 500 may be incorporated to add the earthquake security fastening screws, such as cage nuts, through holes in the adapter plate and the bracket.

In at least one embodiment, the method, at step 508, includes fixedly coupling a bridge plate with the manifold at its first surface and then releasably coupling the adapter plate on to a second surface of the bridge plate. In at least one embodiment, fastening the adapter plate to the manifold in step 508 includes using an option to fixedly couple the adapter plate to the manifold. In at least one embodiment, a further stabilizing step may be performed in the method 500 by fastening the adapter plate to cage nuts of the bracket using third holes on the adapter plate. In at least one embodiment, determining the configurable positions is step 504 is performed so that spacing between the holes available for the buttons enables fastening of the manifold and a second manifold with the adapter plate.

In at least one embodiment, the system for affixing a manifold to a rack includes fixing or determining the manifold position and button locations, so that the manifold can be aligned with the valves connections that complete a secondary cooling loop connections to a CDU of a cooling system. In at least one embodiment, the system includes determined button locations to afford configurable positions for the buttons. The determined button locations may include locations that align the adapter plate with keyholes on existing PDU mounting bracket. This enables the system to take advantage of existing mounting brackets, without adding new parts to an existing rack. In at least one embodiment, the system includes determined locations (e.g., hole 470) for the bracket to allow the bracket to be mounted with a rack using a proprietary fastening system, such as by cage nuts, when a deployed rack does not include brackets, such as a PDU mounting bracket.

In at least one embodiment, the system herein provides a solution that eliminates any requirement for drilling holes in a bracket. The system herein also minimizes the number of datacenter personnel and installation time required to install the manifold from any number of people to one person. In example installations, the installation time markedly changed from 30 minutes to about 2 minutes, per rack, using at least one embodiment of the system herein. In at least one embodiment, the system herein is a solution that will reduce downtime by enabling designing of a customized solution on the fly. At least this feature allows the datacenter to focus work on other issues within the datacenter than overload person and time on existing equipment.

In at least one embodiment, the system herein is a solution providing options to eliminate at least one requirement to remove a rack manifold from the data center for reworking amidst security restrictions in place. The system herein at least eliminates a requirement to have specialized trained technicians enter the data center to obtain approvals for personnel and identified reworking of manifolds. This eliminates the need to remove a manifold, to obtain approvals to transfer the manifold to an outside rework environment having specialized tooling, or to have a manifold design create a replacement manifold. This also eliminates dealing with approvals to enter data for installing or re-installing new manifolds.

In at least one embodiment, the system herein provides an adapter kit that includes complete approved configuration options, including brackets and hardware, to enable setup of a rack manifold on deployed racks without security violations incurred by traveling in and out of the datacenter to retrieve specialized tools, hardware, and to address any removal and installation issues for a datacenter customer, who may be distinct from a solution provider for installing, repairing, and maintaining the racks within the datacenter.

Figure 6:
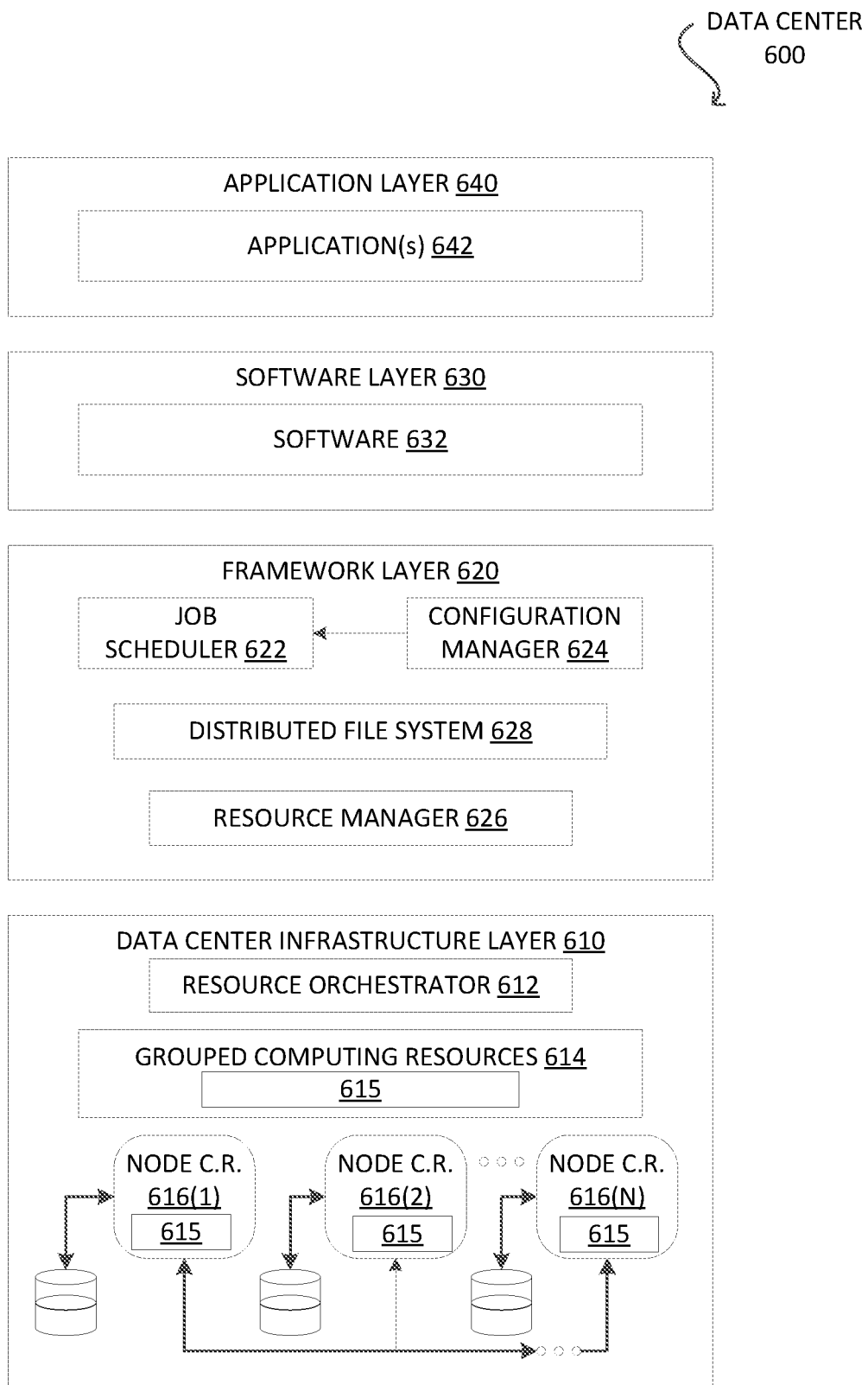
FIG. 6 illustrates an example datacenter, in which at least one embodiment from FIGS. 2A-5 may be used.

FIG. 6 illustrates an example datacenter 600, in which at least one embodiment from FIGS. 2A-5 may be used. In at least one embodiment, datacenter 600 includes a datacenter infrastructure layer 610, a framework layer 620, a software layer 630, and an application layer 640. In at least one embodiment, the infrastructure layer 610, the framework layer 620, the software layer 630, and the application layer 640 may be partly or fully provided via computing components on server trays located in racks 200 of the datacenter 100. This enables cooling systems of the present disclosure to direct cooling to certain ones of the computing components in an efficient and effective manner, and enables real-time replacement and installation of manifolds in dense datacenters. Further, aspects of the datacenter, including the datacenter infrastructure layer 610, the framework layer 620, the software layer 630, and the application layer 640, which may all benefit from the cooling system and method discussed with at least reference to FIGS. 2A-5 above.

In at least one embodiment, as in FIG. 6, datacenter infrastructure layer 610 may include a resource orchestrator 612, grouped computing resources 614, and node computing resources ("node C.R.s") 616(1)-616(N), where "N" represents any whole, positive integer. In at least one embodiment, node C.R.s 616(1)-616(N) may include, but are not limited to, any number of central processing units ("CPUs") or other processors (including accelerators, field programmable gate arrays (FPGAs), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 616(1)-616(N) may be a server having one or more of above-mentioned computing resources.

In at least one embodiment, grouped computing resources 614 may include separate groupings of node C.R.s housed within one or more racks (not shown), or many racks housed in datacenters at various geographical locations (also not shown). Separate groupings of node C.R.s within grouped computing resources 614 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 612 may configure or otherwise control one or more node C.R.s 616(1)-616(N) and/or grouped computing resources 614. In at least one embodiment, resource orchestrator 612 may include a software design infrastructure ("SDI") management entity for datacenter 600. In at least one embodiment, resource orchestrator may include hardware, software or some combination thereof.

In at least one embodiment, as shown in FIG. 6, framework layer 620 includes a job scheduler 622, a configuration manager 624, a resource manager 626 and a distributed file system 628. In at least one embodiment, framework layer 620 may include a framework to support software 632 of software layer 630 and/or one or more application(s) 642 of application layer 640. In at least one embodiment, software 632 or application(s) 642 may respectively include web-based service software or applications, such as those provided by Amazon Web Services, Google Cloud and Microsoft Azure. In at least one embodiment, framework layer 620 may be, but is not limited to, a type of free and open-source software web application framework such as Apache Spark™ (hereinafter "Spark") that may utilize distributed file system 628 for large-scale data processing (e.g., "big data"). In at least one embodiment, job scheduler 622 may include a Spark driver to facilitate scheduling of workloads supported by various layers of datacenter 600. In at least one embodiment, configuration manager 624 may be capable of configuring different layers such as software layer 630 and framework layer 620 including Spark and distributed file system 628 for supporting large-scale data processing. In at least one embodiment, resource manager 626 may be capable of managing clustered or grouped computing resources mapped to or allocated for support of distributed file system 628 and job scheduler 622. In at least one embodiment, clustered or grouped computing resources may include grouped computing resource 614 at datacenter infrastructure layer 610. In at least one embodiment, resource manager 626 may coordinate with resource orchestrator 612 to manage these mapped or allocated computing resources.

In at least one embodiment, software 632 included in software layer 630 may include software used by at least portions of node C.R.s 616(1)-616(N), grouped computing resources 614, and/or distributed file system 628 of framework layer 620. One or more types of software may include, but are not limited to, Internet web page search software, e-mail virus scan software, database software, and streaming video content software.

In at least one embodiment, application(s) 642 included in application layer 640 may include one or more types of applications used by at least portions of node C.R.s 616(1)-616(N), grouped computing resources 614, and/or distributed file system 628 of framework layer 620. One or more types of applications may include, but are not limited to, any number of a genomics application, a cognitive compute, and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 624, resource manager 626, and resource orchestrator 612 may implement any number and type of self-modifying actions based on any amount and type of data acquired in any technically feasible fashion. In at least one embodiment, self-modifying actions may relieve a datacenter operator of datacenter 600 from making possibly bad configuration decisions and possibly avoiding underutilized and/or poor performing portions of a datacenter.

In at least one embodiment, datacenter 600 may include tools, services, software or other resources to train one or more machine learning models or predict or infer information using one or more machine learning models according to one or more embodiments described herein. In at least one embodiment, in at least one embodiment, a machine learning model may be trained by calculating weight parameters according to a neural network architecture using software and computing resources described above with respect to datacenter 600. In at least one embodiment, trained machine learning models corresponding to one or more neural networks may be used to infer or predict information using resources described above with respect to datacenter 600 by using weight parameters calculated through one or more training techniques described herein. As previously discussed, deep learning techniques may be used to support intelligent control of the flow controllers in the refrigerant-assisted cooling by monitoring area temperatures of the datacenter. Deep learning may be advanced using any appropriate learning network and the computing capabilities of the datacenter 600. As such, a deep neural network (DNN), a recurrent neural network (RNN) or a convolutional neural network (CNN) may be supported either simultaneously or concurrently using the hardware in the datacenter. Once a network is trained and successfully evaluated to recognize data within a subset or a slice, for instance, the trained network can provide similar representative data for using with the collected data.

In at least one embodiment, datacenter 600 may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as pressure, flow rates, temperature, and location information, or other artificial intelligence services Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "including," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Use of a set (e.g., a set of items) or subset, unless otherwise noted or contradicted by context, is to be construed as a nonempty collection including one or more members. Further, unless otherwise noted or contradicted by context, a subset of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language may not be intended to imply that certain embodiments require at least one of A, at least one of B, and at least one of C each to be present. In addition, unless otherwise noted or contradicted by context, a plurality indicates a state of being plural (e.g., a plurality of items indicates multiple items). A plurality is at least two items, but can be more when so indicated either explicitly or by context. Further, unless stated otherwise or otherwise clear from context, based on means based at least in part on and not based solely on.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification, references to processing, computing, calculating, determining, or the like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:
   an adapter plate to couple a plurality of different types of cooling manifolds to one or more server racks, the adapter plate forming a plurality of holes to receive one or more buttons in configurable positions to support a weight of a cooling manifold of the plurality of different types of cooling manifolds; and
   a bridge plate to couple the plurality of different types of cooling manifolds to the adapter plate, wherein the bridge plate comprises:
      a first surface that is welded to the cooling manifold; and
      a second surface that releasably couples to the adapter plate, wherein the second surface is opposite the first surface.

2. The system of claim 1 further comprising the one or more buttons, wherein the configurable positions enable the one or more buttons attached to the adapter plate to mate with keyholes of a bracket of the one or more server racks.

3. The system of claim 2, the one or more buttons being fastened to the adapter plate at one or more of the holes of the plurality of holes via one or more fasteners.

4. The system of claim 2, wherein the adapter plate comprises one or more second holes to enable fastening of the adapter plate to the cooling manifold.

5. The system of claim 2, wherein the adapter plate comprises one or more additional holes to enable fastening of the adapter plate to cage nuts of the bracket.

6. The system of claim 2, wherein a button of the one or more buttons comprises:
   at least two flanges separated by a neck and having a central recess to receive a fastener to fasten the button to the adapter plate to a hole of the plurality of holes.

7. The system of claim 6, wherein a flange of the at least two flanges has a diameter configured to fit within a broader feature of a keyhole of the keyholes, wherein the flange is to fasten within a narrow feature of the keyhole.

8. The system of claim 1, further comprising:
a bracket to couple to a server rack of the one or more server racks and to the adapter plate.

9. A system comprising:
an adapter plate to couple a cooling manifold to a plurality of different types of server racks, the adapter plate forming a plurality of holes to receive one or more buttons in configurable positions to support a weight of the cooling manifold; and
a bridge plate to couple the cooling manifold to the adapter plate, wherein the bridge plate comprises:
a first surface that is welded to the cooling manifold; and
a second surface that releasably couples to the adapter plate, wherein the second surface is opposite the first surface.

10. The system of claim 9 further comprising the one or more buttons, wherein the configurable positions enable the one or more buttons attached to the adapter plate to mate with keyholes of a bracket of the plurality of different types of server racks.

11. The system of claim 10, the one or more buttons being fastened to the adapter plate at one or more of the holes of the plurality of holes via one or more fasteners.

12. The system of claim 10, wherein the adapter plate comprises one or more second holes to enable fastening of the adapter plate to the cooling manifold.

13. The system of claim 10, wherein the adapter plate comprises one or more additional holes to enable fastening of the adapter plate to cage nuts of the bracket.

14. The system of claim 10, wherein a button of the one or more buttons comprises:
at least two flanges separated by a neck and having a central recess to receive a fastener to fasten the button to the adapter plate to a hole of the plurality of holes.

15. The system of claim 14, wherein a flange of the at least two flanges has a diameter configured to fit within a broader feature of a keyhole of the keyholes, wherein the flange is to fasten within a narrow feature of the keyhole.

16. The system of claim 9, further comprising:
a bracket to couple to a server rack of the plurality of different types of server racks and to the adapter plate.

* * * * *